US 6,562,184 B2

(12) United States Patent
Sommer

(10) Patent No.: US 6,562,184 B2
(45) Date of Patent: May 13, 2003

(54) PLANARIZATION SYSTEM WITH MULTIPLE POLISHING PADS

(75) Inventor: Phillip R. Sommer, Newark, CA (US)

(73) Assignee: Applied Materials, Inc., Santa Clara, CA (US)

(*) Notice: Subject to any disclaimer, the term of this patent is extended or adjusted under 35 U.S.C. 154(b) by 9 days.

(21) Appl. No.: 09/796,303

(22) Filed: Feb. 27, 2001

(65) Prior Publication Data

US 2001/0046774 A1 Nov. 29, 2001

Related U.S. Application Data

(60) Provisional application No. 60/185,812, filed on Feb. 29, 2000.

(51) Int. Cl.$^7$ ............................ H01L 21/306; B24B 7/00
(52) U.S. Cl. ...................... 156/345.12; 156/345.1; 451/66; 438/691; 438/692
(58) Field of Search ................. 156/345.12, 345.2, 156/345.31, 345.22; 118/719

(56) References Cited

U.S. PATENT DOCUMENTS

| | | | |
|---|---|---|---|
| 5,335,453 A | | 8/1994 | Baldy et al. .................. 51/67 |
| 5,498,199 A | * | 3/1996 | Karlsrud et al. ............ 451/289 |
| 5,655,954 A | * | 8/1997 | Oishi et al. .................. 451/67 |
| 5,738,574 A | | 4/1998 | Tolles et al. ................ 451/288 |
| 5,804,507 A | | 9/1998 | Perlov et al. ................ 438/692 |
| 5,908,530 A | | 6/1999 | Hoshizaki et al. .......... 156/345 |
| 5,957,764 A | | 9/1999 | Anderson et al. ........... 451/285 |
| 5,985,039 A | | 11/1999 | Yonemizu et al. ............ 134/2 |
| 6,036,582 A | | 3/2000 | Aizawa et al. ............... 451/41 |
| 6,068,542 A | | 5/2000 | Hosokai ...................... 451/37 |
| 6,149,507 A | * | 11/2000 | Lee et al. ..................... 451/66 |
| 6,213,853 B1 | * | 4/2001 | Gonzalez-Martin et al. 451/287 |
| 6,227,950 B1 | * | 5/2001 | Hempel et al. .............. 451/66 |

FOREIGN PATENT DOCUMENTS

| | | | |
|---|---|---|---|
| EP | 0 793 261 | 9/1997 | ........... H01L/21/00 |
| JP | 01132766 A | * 5/1989 | ........... C23C/14/50 |
| JP | 2001274121 A | * 10/2001 | ......... H01L/21/304 |
| WO | WO 00/48787 | 8/2000 | ............. B24B/5/00 |
| WO | WO 00/53371 | 9/2000 | ........... B24B/37/04 |

OTHER PUBLICATIONS

Donohue, "Polishing Media Magazine For Improving Polishing", U. S. Patent Application Ser. No. 09/583,507, filed May 31, 2000;.
White et al. "Planarization System with Multiple Polishing Pads" U. S. Patent Application Ser. No. 09/556,495, filed Oct. 31, 1997;.
Sommer et al. "Chemical Mechanical Planarization" U.S. Patent Application Ser. No. 09/651,659, filed Aug 29, 2000;.
Sommer, Phillip R "Linear Drive System for Chemical Mechanical Polishing" U.S. Patent Application Ser. No. 08/961,602, filed Oct. 31, 1997;.
Sommer et al. "Chemical Mechanical Planarization System" U.S. Patent Application Ser. No. 09/718,552, filed Nov. 22, 2000.
PCT International Search Report from PCT/US 01/06290, Dated Nov. 15, 2001.

* cited by examiner

Primary Examiner—Gregory Mills
Assistant Examiner—Michelle Crowell
(74) Attorney, Agent, or Firm—Moser, Patterson & Sheridan

(57) ABSTRACT

A chemical mechanical planarization system for planarizing wafers is provided. The system generally includes a transfer corridor, at least one corridor robot, one or more polishing modules and at least one loading device. The corridor robot is disposed in the transfer corridor and is positionable between a first end and a second end of the transfer corridor. The loading device is adapted to transfer workpieces between the transfer corridor and the polishing modules. Generally, the loading device includes at least one load cup. The one or more polishing modules each include one or more polishing heads for holding workpieces during processing.

25 Claims, 11 Drawing Sheets

PLANARIZATION SYSTEM WITH MULTIPLE POLISHING PADS

This application is related to U.S. patent application No. 09/718,552, filed Nov. 22, 2000, which is hereby incorporated by reference in its entirety. This application additionally claims benefit of U.S. Provisional Application No. 60/185,812, filed Feb. 29, 2000, which is hereby incorporated by reference in its entirety.

BACKGROUND OF THE DISCLOSURE

1. Field of Invention

The present invention relates generally to a system and method for planarization of a workpiece such as a semiconductor substrate or wafer.

2. Background of Invention

In semiconductor wafer processing, the use of chemical mechanical planarization, or CMP, has gained favor due to the enhanced ability to increase device density on a semiconductor workpiece, or substrate, such as a wafer. As the demand for planarization of layers formed on wafers in semiconductor fabrication increases, the requirement for greater system (i.e., tool) throughput with less wafer damage and enhanced wafer planarization has also increased.

Two CMP systems that address these issues are described in U.S. Pat. No. 5,804,507, issued Sep. 8, 1998 to Perlov et al. and in U.S. Pat. No. 5,738,574, issued Apr. 15, 1998 to Tolles et al., both of which are hereby incorporated by reference in their entirety. Perlov et al. and Tolles et al. disclose a CMP system having a planarization apparatus that is supplied wafers from cassettes located in an adjacent liquid filled bath. A transfer mechanism, or robot, facilitates the transfer of the wafers from the bath to a transfer station. From the transfer station, the wafers are loaded to one of four processing heads mounted to a carousel. The carousel moves the processing heads and wafers to various planarization stations where the wafers are planarized by moving the wafer relative to a polishing pad in the presence of a slurry or other fluid medium. The polishing pad may include an abrasive surface. Additionally, the slurry may contain both chemicals and abrasives that aid in the removal of material from the wafer. After completion of the planarization process, the wafer is returned back through the transfer station to the proper cassette located in the bath.

Another system is disclosed in U.S. Pat. No. 5,908,530, issued Jun. 1, 1999 to Hoshizaki et al., which is hereby incorporated by reference in its entirety. Hoshizaki et al. teaches an apparatus for planarizing wafers wherein the wafer is subjected to uniform velocity across the wafer surface with respect to the abrasive surface. The uniform velocity across the wafer surface coupled with a multi-programmable planarization pattern results in a uniform rate of material removal from the wafer surface. In addition, Hoshizaki et al. provides a number of optional routines that allow a user to fine tune material removal from the wafer.

Another system is disclosed in U.S. patent application No. 09/556,495, filed Apr. 21, 2000 to Sommer (hereinafter referred to as Sommer '495 describes a planarization system comprising two polishing heads for retaining wafers coupled to a drive system disposed over a single web. By polishing two wafers simultaneously on a single web, the rate of wafer throughput is enhanced.

The systems described above can generally utilize polishing pads with and without abrasive finishes. The polishing pads may be stationary or move relative to the wafer, e.g., rotationally or linearly. Additionally, abrasive slurry, de-ionized water and other fluids may be delivered to the polishing pad during processing.

Common to these and other systems is the need to reduce the cost of ownership and to increase the wafer throughput. Both of these attributes are highly desirably and necessary to remain competitive in the semiconductor marketplace. The cost of ownership can be effectively reduced by providing a system having a compact footprint. Small system footprints allow for a greater number of systems in a facility production area, thus decreasing the system cost per unit factory area while contributing to an increase in factory capacity by freeing floor space for other processing and support systems. Additionally, increased throughput both contributes to reducing the cost of ownership while reducing manufacturing costs associated with production/machine time. Increased throughput also decreases the cost per processed wafer that allows for greater profitability and increased latitude on product pricing, factors that greatly enhance the manufacturer's market position relative to his competitors.

Therefore, there is a need for a chemical mechanical wafer planarization system that provides increased wafer throughput while minimizing the footprint of the system.

SUMMARY OF INVENTION

One aspect of the present invention provides a chemical mechanical planarization system for planarizing wafers including a wafer transfer corridor. In an exemplary embodiment, the system includes a transfer corridor, at least one corridor robot, one or more polishing modules and at least one loading device. The corridor robot is disposed in the transfer corridor and is positionable between a first end and a second end of the transfer corridor. The one or more polishing modules each include one or more polishing heads for holding workpieces during processing. The polishing modules are disposed adjacent the transfer corridor. The loading device is disposed between the transfer corridor and the polishing modules and is adapted to transfer workpieces therebetween. Generally, the loading device includes at least one load cup.

In another embodiment of the invention, the planarization system additionally comprises a first robot, a second robot, one or more workpiece (e.g., wafer) storage cassettes, and a cleaning module. The first robot is adapted to transfer the workpiece between the storage cassettes, the cleaning module and the first staging area. The second robot is adapted to transfer the workpiece between the second staging area and the cleaning module.

In another aspect of the invention, a method of processing a workpiece is disclosed. In an exemplary embodiment, the method generally comprises the steps of gripping one or more workpieces from a first staging area by a first robot, transferring the one or more workpieces gripped by the first robot to one or more load cups, transferring the one or more workpieces in the load cups into respective polishing heads of a first chemical mechanical polishing module, processing the one or more workpieces, transferring the one or more workpieces from the respective polishing heads into the one or more load cups, gripping one or more workpieces from the one or more load cups by the first robot, and, transferring the one or more workpieces gripped by the first robot to a second staging area. In another embodiment, the method additionally comprises the steps of simultaneously processing a second set of one or more workpieces in a second polishing module in a loading sequence similar to the first.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAIL DESCRIPTION OF INVENTION

Figure 1:
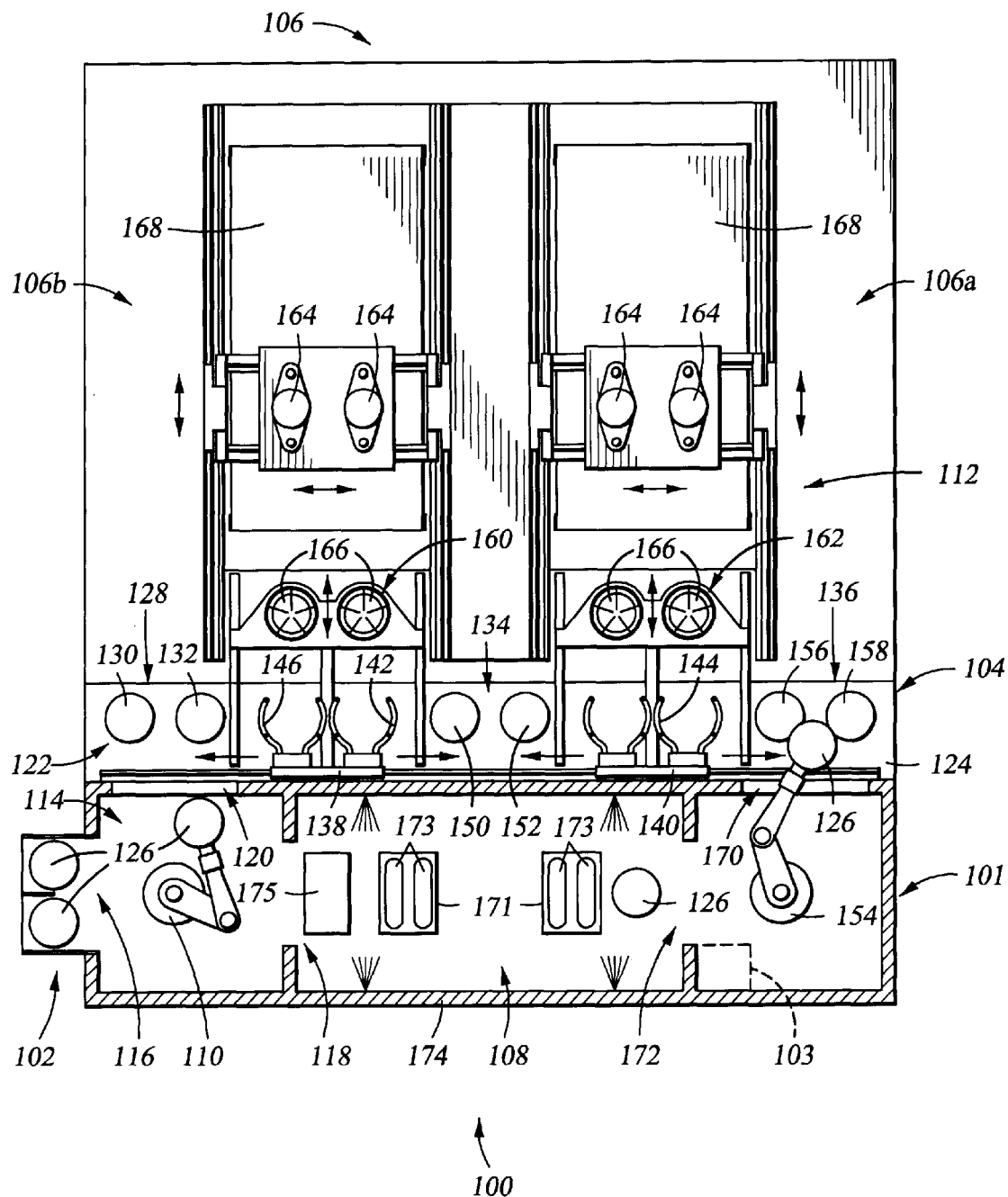
FIG. 1 is a schematic plan view of a chemical mechanical planarization system of the present invention.

FIG. 1 depicts a schematic view of a chemical mechanical planarization system 100 that generally includes a factory interface 101, one or more polishing modules 106 (illustratively shown as a first polishing module 106A and a second polishing module 106B) and a wafer transfer corridor 104. Generally, the wafer transfer corridor 104 is disposed between the polishing modules 106 and the factory interface 101 to facilitate wafer transfer therebetween. The embodiment of the system 100 shown in FIG. 1 is configured to process two wafers at a time on each polishing module 106. However, the system 100 may alternatively be configured to process single wafers, or more than two wafers on each polishing module 106.

The factory interface 101 generally comprises one or more wafer storage cassettes 102, a first transfer robot 110, a second transfer robot 154 and a cleaning module 108. The cleaning module 108 is typically disposed between the first transfer robot 110 and the second transfer robot 154. The first transfer robot 110 is disposed in an enclosure 114 proximate the cleaning module 108. The enclosure 114 has at least a first port 116, a second port 118 and a third port 120. The first port 116 is adapted to accept the one or more wafer cassettes 102. The second port 118 is typically disposed opposite the first port 116 and defines the exit of the cleaning module 108. The third port 120 is typically disposed between the first port 116 and the second port 118. The third port 120 provides access to a first end 122 of the wafer transfer corridor 104. The enclosure 114 may additionally comprise a Class 10,000 environment within the enclosure 114 to minimize particulate contamination during wafer transfer. Such an environment may be provided utilizing HEPA air filters such as those available from Camfil-Farr Corporation, of Riverdale, N.J.

The first transfer robot 110 is configured to transfer workpieces or wafers 126 between the exit of the cleaning module 108, the one or more wafer storage cassettes 102 and the first end 122 of the wafer transfer corridor 104. The second transfer robot 154 is configured to handle wafers in a "wet" condition after polishing and is generally configured similarly to the first transfer robot 110. One skilled in the art will recognize that other types of wafer transfer robots having a suitable range of motion may be alternatively utilized.

Figure 2:
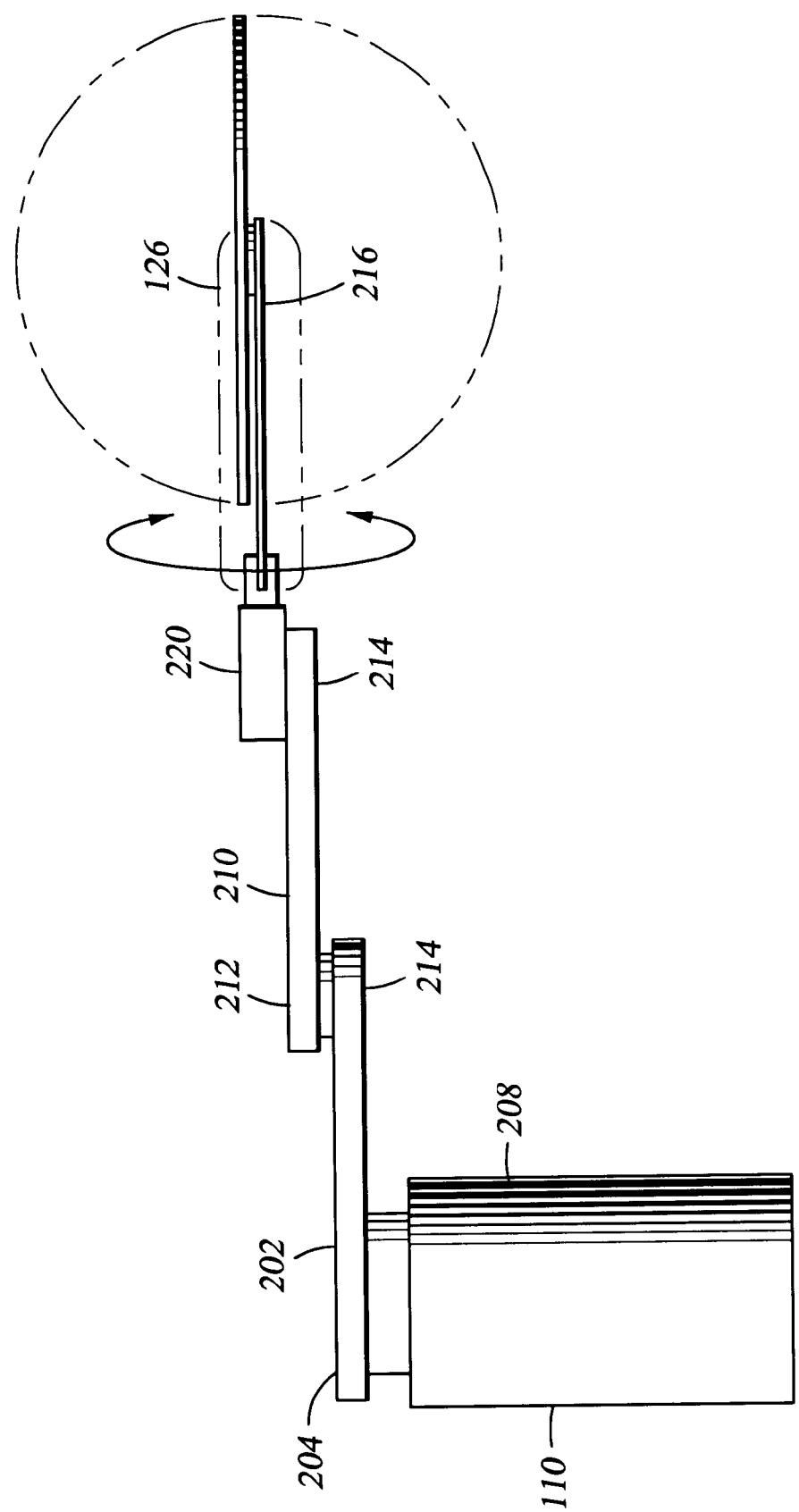
FIG. 2 depicts an elevation of a transfer robot.

FIG. 2 depicts one embodiment of the first transfer robot 110. The first transfer robot 110 is generally a multi-link, single blade robot having a range of motion suitable to transfer the wafer 126 between the cleaning module 108, the storage cassettes 102 and the wafer transfer corridor 104. In one embodiment, the first transfer robot 110 includes a first arm 202 having a proximate end 204 coupled to a cylinder 206 that can be actuated through a vertical range of motion from a base 208 of the first transfer robot 110. A second arm 210 has a proximate end 212 coupled to a distal end 214 of the first arm 202. A vacuum blade 216 is coupled to the distal end 218 of the second arm 210. Typically, the vacuum blade 216 is coupled to the second arm 210 via a rotary actuator 220 so that the wafer 126 may be orientated "feature-side down" for processing. The vacuum blade 216 provides a gripping means for securing the wafer 126 to the first transfer robot 110 during wafer transfer. Optionally, other types of gripping means may be utilized, such as edge clamps, electrostatic chucks and the like. The second transfer robot 154 is similarly configured.

Referring back to FIG. 1, the second transfer robot 154 is positioned to transfer wafers 126 between a second end 124 of the wafer transfer corridor 104 and an entrance 172 of the cleaning module 108. The second transfer robot 154 is configured to load wafers from the wafer transfer corridor 104 into the cleaning module 108. Optionally, a metrology device 103, such as available from Nova Measuring Instruments, Ltd., of Phoenix, Ariz., may be disposed adjacent the second transfer robot 154 to provide information regarding layer thickness or other processing metric such as defect scanning.

The cleaning module 108 generally comprises an enclosure 174 having the entrance port 172 proximate the second transfer robot 154 and the exit port defined by the second port 118 of the enclosure 114. The cleaning module 108 may comprise any number or combination of known processes utilized for cleaning residual slurry, contamination and other polishing residues from the surfaces of the polished wafer. Generally, the cleaning module 108 includes a conveyor (not shown) that receives processed wafers from the second transfer robot 154. The conveyor transports the wafers 126 through one or more cleaning zones 171 where the wafer is cleaned by spraying the wafers with a cleaning fluid or de-ionized water, scrubbing the wafers using brushes 173, and/or by using ultra and megasonic energy. The wafers can be cleaned either in a horizontal or vertical position. Those wafers cleaned vertically benefit from the assistance of gravity in removing the slurry and other contaminants from the wafer. Once the wafer has been cleaned it can be introduced into a spin-rinse-dry device 175 where the wafer can be rinsed and dried. The wafer is then positioned adjacent the second port 118 where the cleaned wafer is removed from the cleaning module by the first transfer robot 110 and returned to one of the wafer cassettes 102. One cleaning module that can be used to advantage in the invention is a MESA wafer cleaner available from Applied Materials, Inc., located in Santa Clara, Calif.

The wafer transfer corridor 104 is generally positioned between the factory interface 101 and the polishing modules 106. The wafer transfer corridor 104 generally comprises at least one corridor robot and at least one loading device. The corridor robot generally moves wafers between staging areas disposed between the first end 122 and the second end 124 of the wafer transfer corridor 104. Typically, each staging area includes one or more staging platforms that facilitate queuing and transferring of wafers between the corridor robot and the wafer transfer robots 110, 154. The loading device generally transfers the wafers between the corridor robot and the polishing module 106.

In one embodiment, the wafer transfer corridor 104 comprises a first corridor robot 138, a second corridor robot 140 and at least one loading device 112. The corridor transfer robots 138, 140 travel between the first end 122 and the second end 124 of the wafer transfer corridor 104. The wafer transfer corridor 104 includes a first staging area 128, a second staging area 136 and a third staging area 134 that is disposed between the first and second staging areas 128, 136. Typically, one loading device 112 is disposed between each staging area 128, 136, 134 and the polishing modules 106. Alternatively, the system 100 may utilize one or more loading devices 112 positioned remotely from the transfer corridor 104.

The first staging area 128 is disposed at the first end 122 of the wafer transfer corridor 104 adjacent the third port 120. In one embodiment, the first staging area 128 includes a first staging platform 130 and a second staging platform 132 disposed therein. The platforms 130, 132 allow both the first transfer robot 110 and the first corridor robot 138 to access wafers disposed thereon.

The third staging area 134 is disposed between the first and second staging areas 128, 136. In one embodiment, the third staging area 134 includes a third staging platform 150 and a fourth staging platform 152 disposed therein. The platforms 150, 152 allow both the first corridor robot 138 and the second corridor robot 140 to access wafers disposed thereon.

The second staging area 136 is disposed at the second end 124 of the wafer transfer corridor 104 adjacent a port 170 that allows the second transfer robot 154 access to the staging area 136. In one embodiment, the second staging area 136 includes a fifth staging platform 156 and a sixth staging platform 158 disposed therein. The platforms 156, 158 allow both the second transfer robot 154 and the second corridor robot 140 to access wafers disposed thereon.

Figure 3:
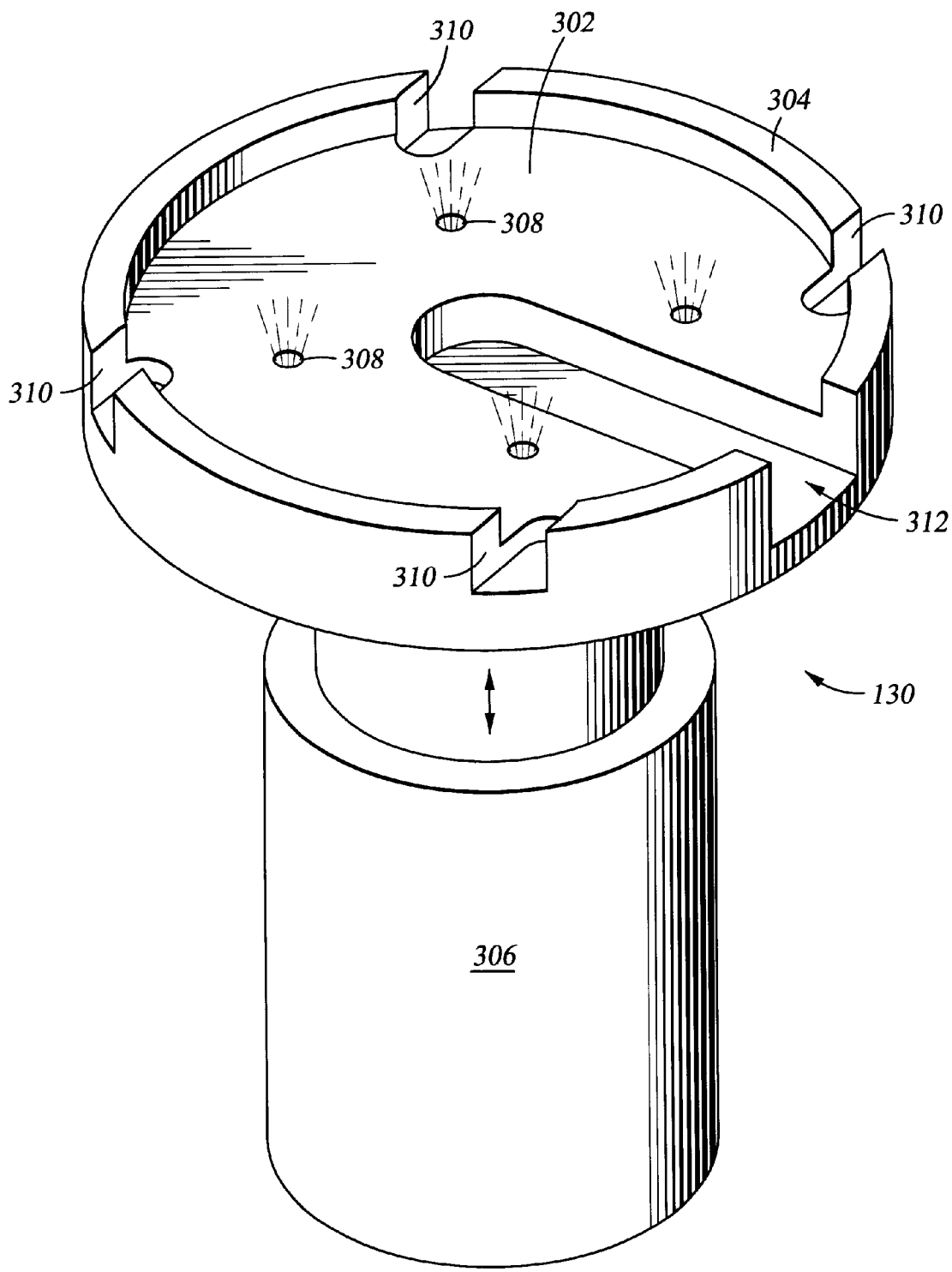
FIG. 3 depicts a staging platform.

FIG. 3 depicts a perspective view of the first staging platform 130. Illustrative of other staging platforms, the first staging platform 130 comprises a circular base 302 that has a raised peripheral rim 304. The raised rim 304 prevents a wafer (not shown) that is set on the base 302 from sliding off. The first staging platform 130 is additionally coupled to an actuator 306 that provides vertical movement to the base 302. Optionally, the first staging platform 130 further comprises one or more fluid nozzles 308 that maintain the wafer in a "wet" condition by bathing the wafer with a fluid such as de-ionized water. Alternatively, the one or more nozzles 308 may be remotely located form the first staging platform 130 or additionally in other locations throughout the system 100 to prevent drying of contaminants (i.e., slurry and/or other materials) on the wafer's surface.

The first staging platform 130 has cut-outs 310 in the raised rim 304 that extend at least partially into the base 304. The cut-outs 310 permit the wafer to be set on and removed from the base 302 of the staging platform by the corridor robots 112 without interfering with the gripping mechanism of the corridor robots 112.

Each staging platform of the first and the second staging areas 128, 136 has a slot 312 in the raised rim 304 that extend at least partially into base 302. The cut-out 312 allows the wand 216 of the transfer robots 110, 154 to set and retrieve the wafer from the base 302 of the staging platforms 130, 132 156, 158.

Figure 4:
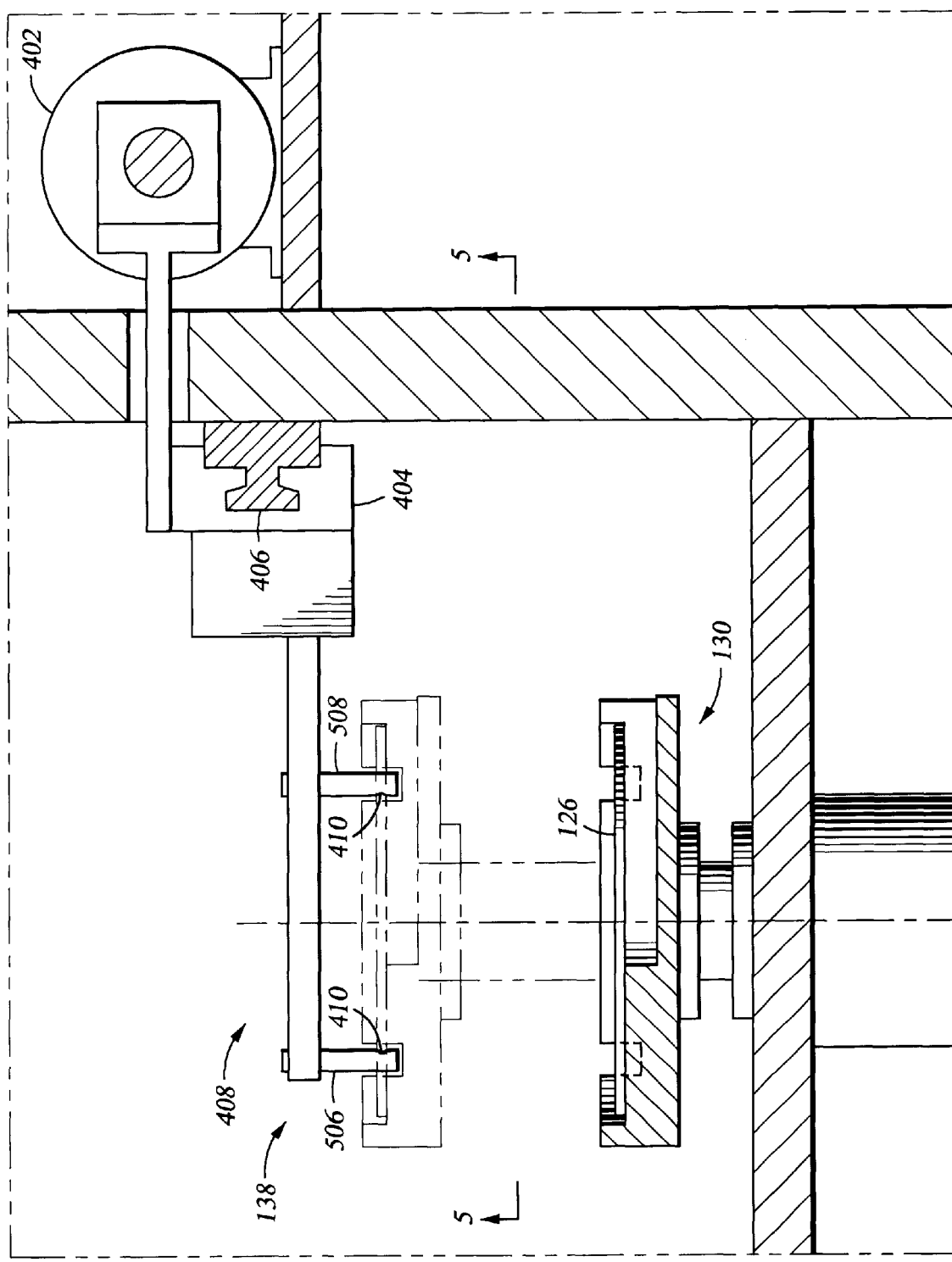
FIG. 4 is a side elevation of a corridor robot.
Figure 5:
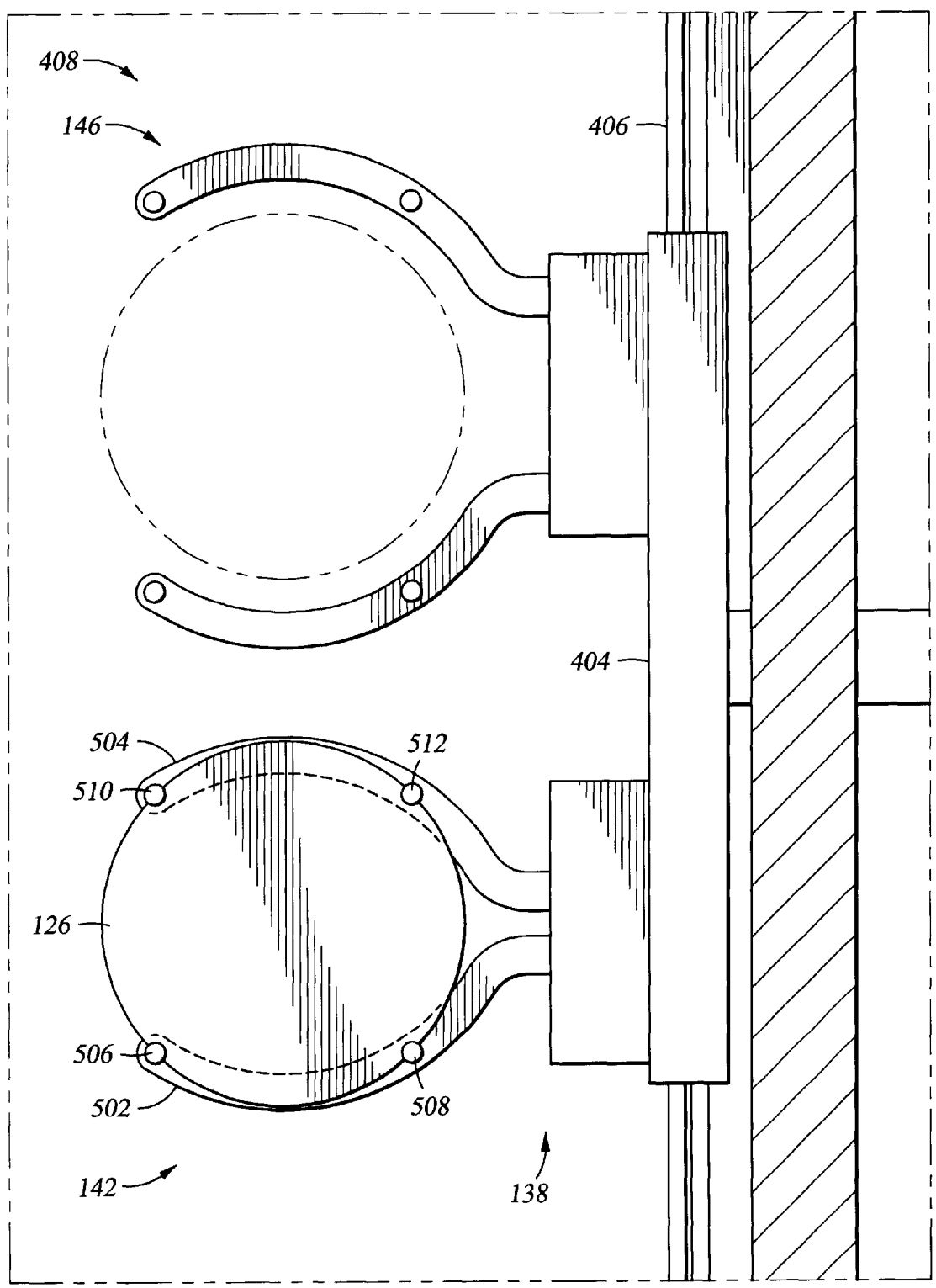
FIG. 5 is a plan view of the corridor robot taken along section line 5—5 of FIG. 4.

FIGS. 4 and 5 depict a side elevation and a bottom plan view of the first corridor robot 138. The reader is encouraged to simultaneously refer to FIGS. 1, 4 and 5 to best understand the first corridor robot 138. The first corridor robot 138 generally includes at least one edge gripper 408 coupled to a guide 404 that moves along a rail 406. Typically, the first corridor robot 138 is configured with the same number of grippers as staging platforms present in the respective area serviced by the robot. An actuator 402, generally a linear motion device moves the first corridor robot 138 along the rail 406. The actuator 402 may comprise a linear motion devices such as a pneumatic cylinder, hydraulic cylinder, ball screw, servo/stepper motor coupled with belt drives or the like able to position the first corridor robot 138 along the rail 406. The second corridor robot 140 may be driven independently from the first corridor robot 138 by a separate actuator (not shown). Optionally, the movement of the corridor robots 138, 140 may be linked. The actuator 402, rail 406 and guide 404 are configured to provide a range of motion such that the edge gripper 408 may access at least two staging areas (e.g., the first staging area 130 and the third staging area 134).

In the illustrative embodiment, the first corridor robot 138 comprises at least a first gripper 142 and a second gripper 146. The first corridor robot 138 has a range of motion that allows the wafers 126 in the first and second staging platforms 130, 132 to the transferred to a third staging platform 150 and a fourth staging platform 152 of the third staging area 134. Similarly, the second corridor robot 140 has a range of motion that allows the wafers in the third and a fourth staging platforms 150, 152 to be transferred to a fifth staging platform 156 and a sixth staging platform 158 of the second staging area 136.

Each gripper 142, 146 generally comprises a first member 502 and an opposing second member 504 as shown in FIG. 5. The first and second member 502, 504 can be actuated to move towards each other. The first member 502 includes a first post 506 and a second post 508 extending perpendicularly therefrom in a spaced-apart relation. The second member 504 includes a third post 510 and a fourth post 512 extending perpendicularly therefrom in a spaced-apart relation. Each post (506, 508, 510 and 512) contains a co-planar notch 410 slightly greater in width than the thickness of the wafer. The first member 502 and the second member 504 are normally in a position such that the posts 506, 508, 510 and 512 are positioned outside of the circumference of the wafer. When the first gripper 142 is actuated, the first member 502 moves closer to the second member 504, closing the first gripper 142. As the first gripper 142 closes, the notches 410 of the respective posts retain the wafer 126 by its perimeter (i.e., edge contact). The second corridor robot 140 is typically configured similarly to the first corridor robot 138.

Referring back to FIG. 1, the first transfer robot 110 typically retrieves an unprocessed wafer 126 from one of the wafer cassettes 102 and places the wafer on either platform 130, 132 residing in first staging area 128. After loading one of the platforms 130, 132, the first transfer robot 110 may retrieve a cleaned, processed wafer exiting the cleaning module 108 and return the cleaned wafer to the wafer cassettes 102 or the robot 110 may retrieve and load another unprocessed wafer on the remaining platform in the first staging area 128.

The wafer transfer corridor 104 is generally positioned between the factory interface 101 and the polishing modules 106. The wafer transfer corridor 104 is orientated such that wafers being transferred along the transfer corridor 104 may be loaded into any of the polishing modules 106. In one embodiment, wafers 126 are transferred between the first staging area 128 and the third staging area 134 via a first corridor robot 138, while wafers 126 are transferred between the third staging area 134 and the second staging area 136 by a second corridor robot 140.

Figure 6:
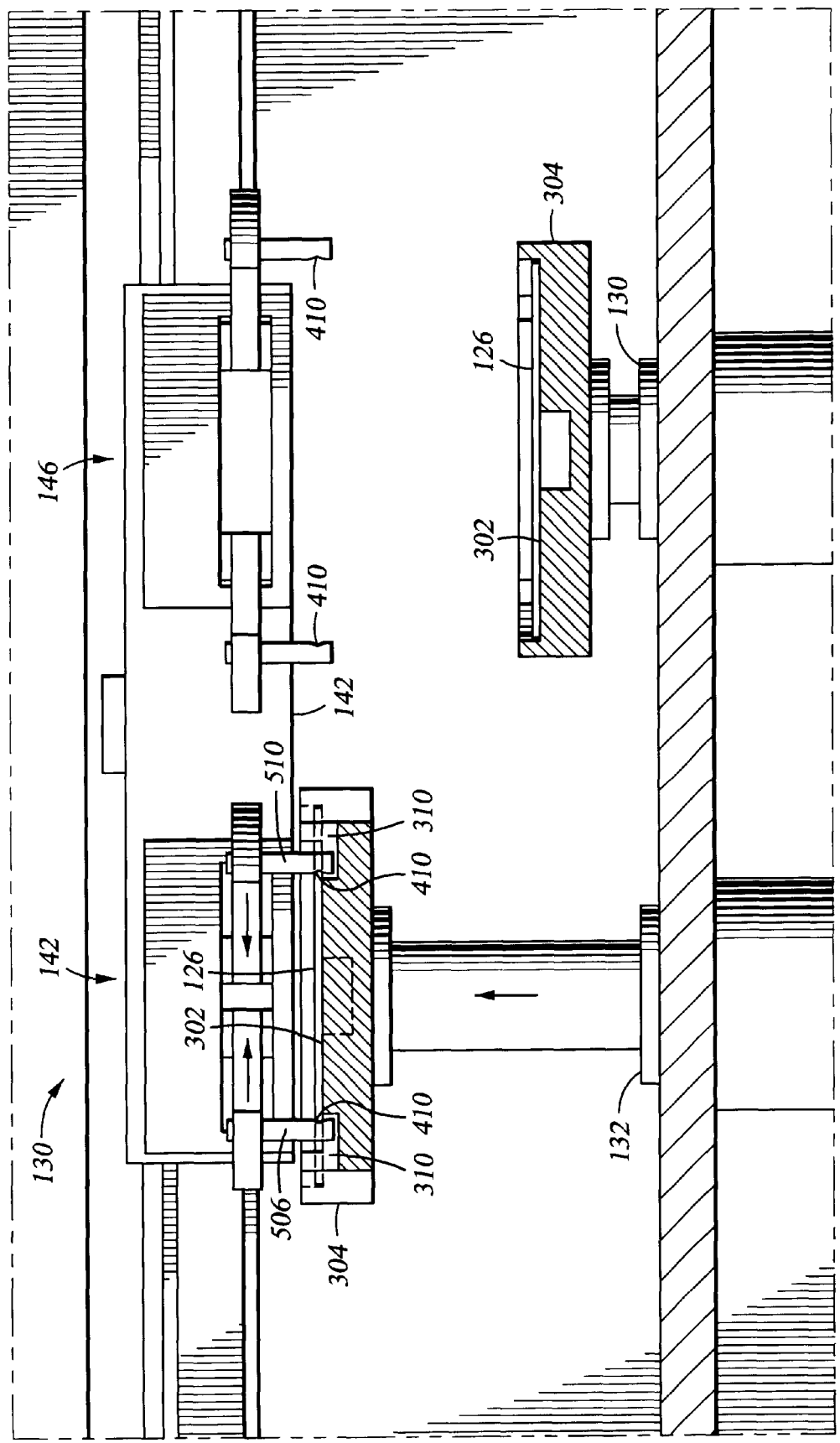
FIG. 6 is an elevation depicting the transfer of workpieces between the corridor robot and the staging platform.

Referring to FIG. 6, transfer of wafers from the first staging platform 130 to the first corridor robot 138 is accomplished by first positioning the first gripper 142 and second gripper 146 above the second staging platform 132 and first staging platform 130, respectively, that are in a lowered position (the second staging platform 132 is shown in a raised position to illustrate securing of the wafer 126 by the first gripper 142). As illustrated by the first gripper 142, second staging platform 132 is raised to align the wafer 126 disposed on the base 302 in a co-planar position with the notches 410 of the posts of the first gripper 142. The first member 502 and the second member 504 are actuated to secure the wafer 126 in the notches 410. The second staging platform 132 is then lowered to allow the posts of the first gripper 142 to clear the raised rim 304 of the second staging platform 132, allowing the first corridor robot 138 to move away from the first staging area 128. In practice, the first and second staging platforms 130, 132 typically move in unison allowing both of the wafers in the first staging area 128 to be transferred simultaneously thus increasing system throughput. Wafers are loaded onto the staging platforms from the grippers in the reverse manner. The other corridor robots interface similarly with the other staging platforms.

Returning to FIG. 1, the one or more loading devices 112 are generally positioned between adjoining staging areas to transfer wafers to and from the polishing modules 106. Alternately, one loading device 112 may service the entire transfer corridor 104. Typically, the loading devices 112 include a positioning mechanism (described below with reference to FIGS. 7 and 8) and one or more load cups 166. The positioning mechanism transfers the one or more load cups 166 between a first position and a second position. In the first position, wafers may be loaded and unloaded from the load cups 166 by one of the corridor robots 138, 140. In the second position, the load cups 166 may transfer the wafers to and from the polishing heads 164 of the polishing modules 106.

In one embodiment, each loading device 112 includes a shuttle table. A first shuttle table 160 is positioned between the first staging area 128 and the third staging area 134, and a second shuttle table 162 is positioned between the third staging area 134 and the second staging area 136.

Figure 7:
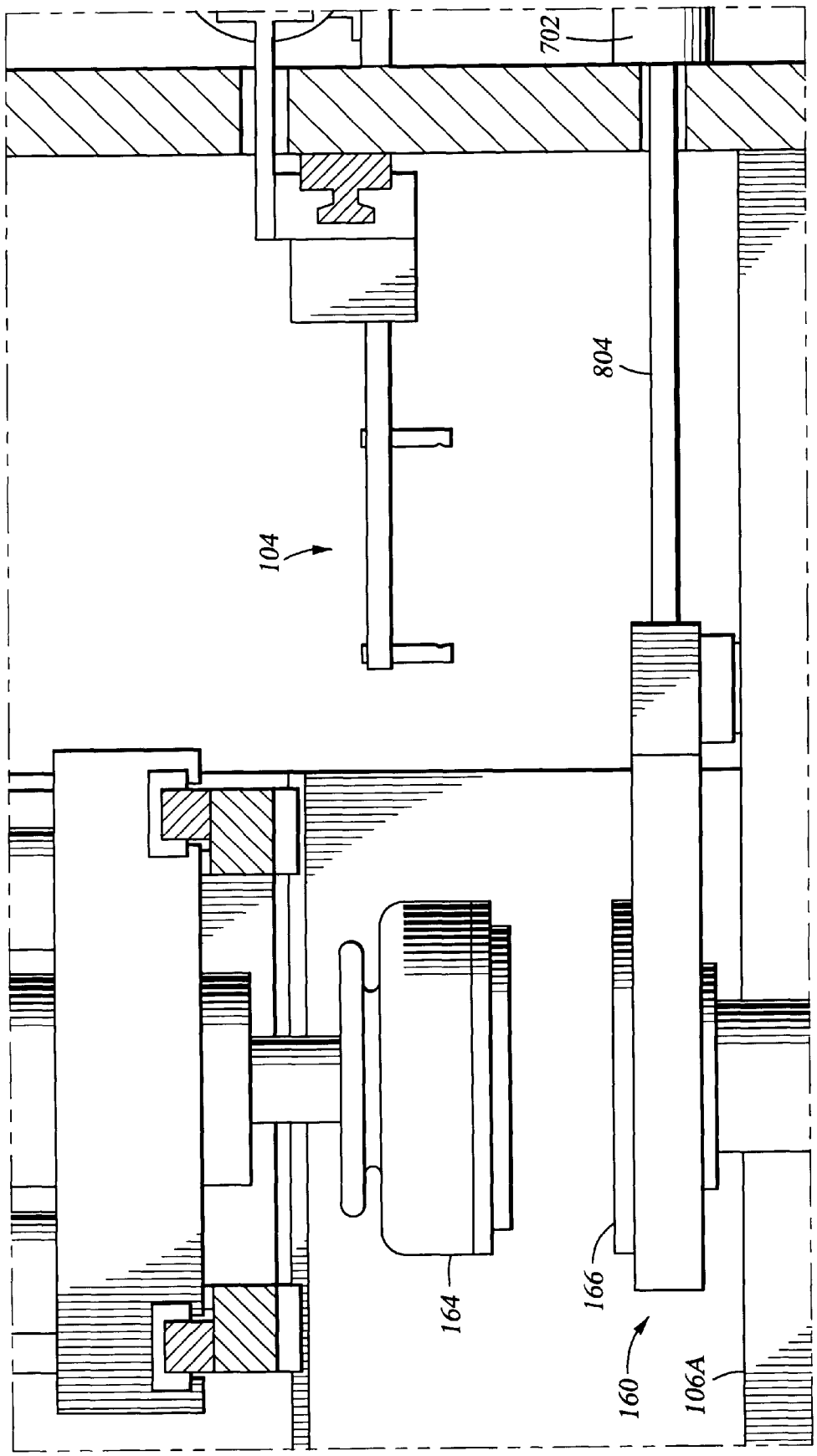
FIG. 7 is an elevation of a shuttle table.
Figure 8:
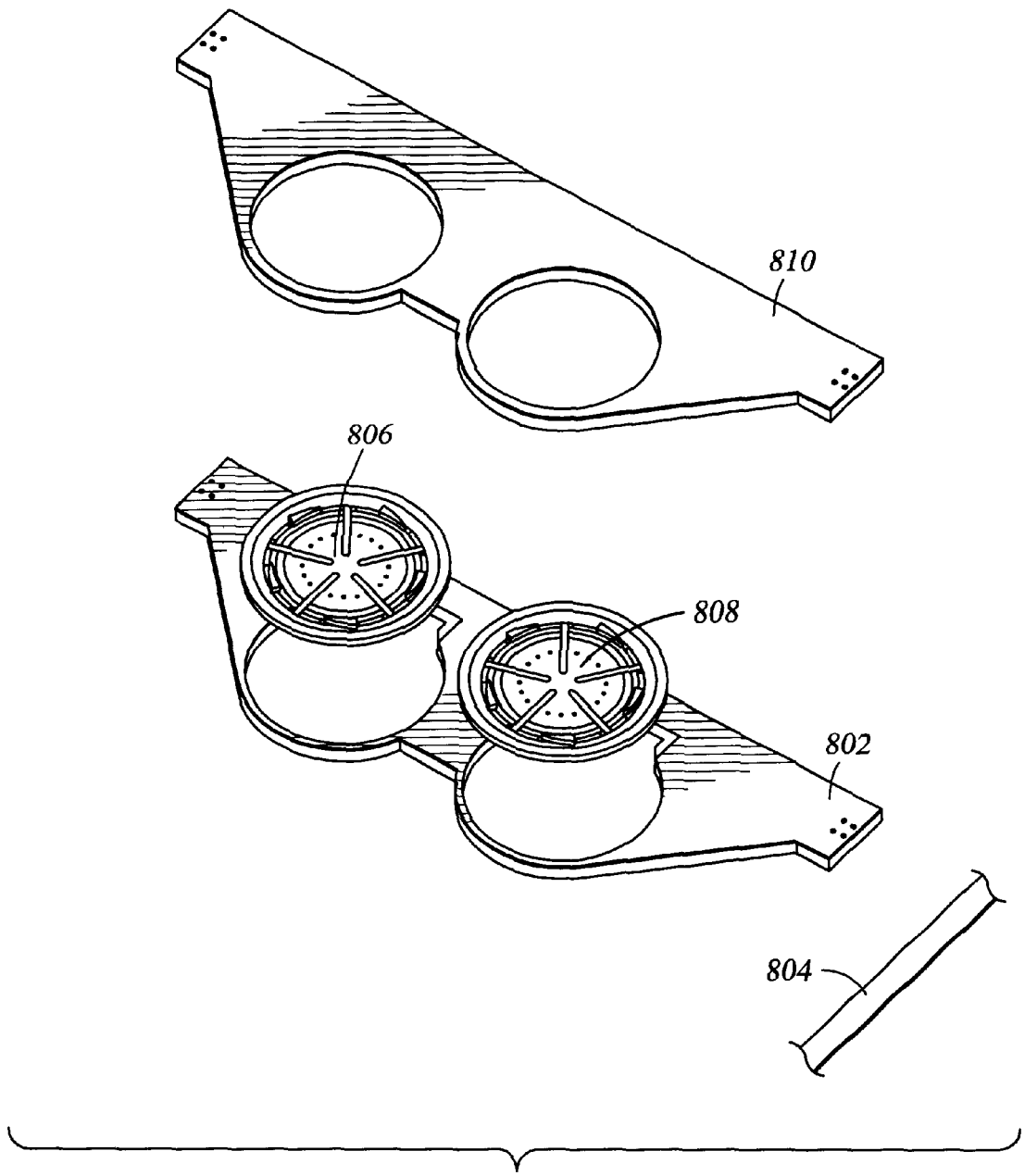
FIG. 8 is an exploded view of the shuttle table of FIG. 7.

FIGS. 7 and 8 are a side elevation and an exploded perspective view of the first shuttle table 160. The reader should note the illustrated first shuttle table 160 depicts an exemplary device for transferring wafers between the transfer corridor 104 and the processing modules 106. The first shuttle table 160 may alternatively comprise other devices capable of transferring wafers between a plurality of processing modules while having the positional accuracy to enable transfer of the wafer into a polishing head.

The illustrative first shuttle table 160 comprises a yoke 802, support members 804, and load cups 166 that include a first load cup 806 and a second load cup 808. The load cups 806, 808 are disposed in the yoke 802, and protrude through a yoke cover 810 fastened to the yoke 802. The support members 804 are coupled to the yoke 802 at one end and are coupled to one or more positioning mechanisms 702 at the other end. The positioning mechanisms 702 permit the load cups 806, 808 to be moved between the transfer corridor 104 and the first polishing module 106A. Generally, the movement of the first shuttle table 160 is typically perpendicular to the movement of the corridor robots 138, 140. The positioning mechanism 702 may comprise any number of linear motion devices, including pneumatic cylinders, hydraulic cylinders, ball screws, servo/stepper motors coupled with belt drives and the like. The support member 804 is of sufficient strength to maintain the load cups 806, 808 in a substantially parallel relation to the polishing heads 164 of the first polishing module 106A during wafer transfer therebetween. The second shuttle table 162 is similarly configured.

The load cups 166 may comprise any number of devices known in the art suitable for positioning the wafer 126 into a polishing head 164. Examples of such load cups are disclosed in the previously incorporated U.S. patent application No. 09/718,522 and U.S. patent application No. 09/414,907, filed Oct. 8, 1999 by Tobin, which is hereby incorporated by reference in it entirety.

Alternatively, one or more loading devices 112 may be positioned adjacent the wafer transfer corridor 104 such that the loading device 112 may transfer wafers between the wafer transfer corridor 104 and one or more load cups 166 positioned on or proximate to a respective polishing modules 106. The load cups 166 are positioned on the polishing module 106 such that wafers within the load cup 166 may be loaded into the polishing heads 164 of the polishing module 106 without damage.

Generally, the loading devices 112 are positioned in a first position proximate the transfer corridor 104 when wafers are to be transferred to or from the corridor robots 138, 140. In an example of a transfer sequence, the corridor robots 138, 140 generally position the wafers held therein concentric to the loading device 112 that is positioned proximate the transfer corridor 104. The load cups 806, 808 are then actuated to rise to a height wherein the wafers are substantially disposed in the load cups. The grippers 142, 146 then release the wafers into the load cups 806, 808. The load cups 806, 808 are lowered to clear the grippers 142, 146 and the loading device is actuated to move away from the transfer corridor 104 and into a position where the wafers may be transferred to the polishing module 106.

Referring back to FIG. 1, the plurality of polishing modules 106 are positioned proximate the wafer transfer corridor 104 so that wafers 126 may be loaded into the polishing modules 106 from the wafer transfer corridor 104 by one or more loading devices 112. The plurality of polishing modules 106, shown as the first polishing module 106A and 106B, are respectively disposed adjacent to the first shuttle table 160 and the second shuttle table 162 of the wafer transfer corridor 104. Each polishing module 106A, 106B is positioned to receive and return wafers to the wafer transfer corridor 104 from a respective loading device 112. The polishing modules 106A, 106B may comprise buffing, polishing, rinsing, cleaning and/or other processes associated with planarizing a workpiece. The polishing modules 106A, 106B may provide either a linear polishing motion or a rotational polishing motion to the wafer relative a polishing surface 168 of the polishing modules 106A, 106B.

Figure 9:
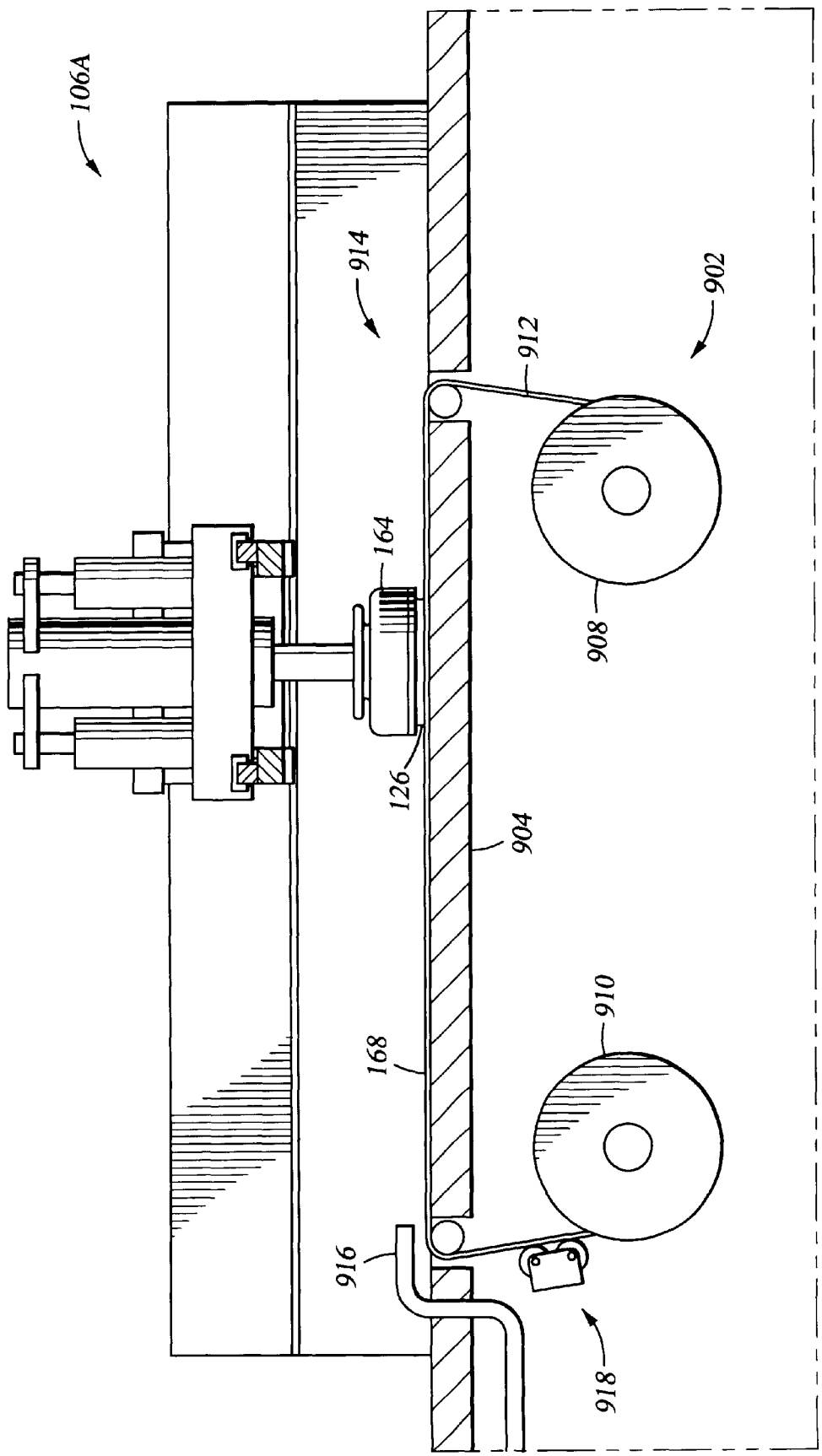
FIG. 9 is an elevation of a polishing module.

FIG. 9 depicts a simplified elevation of one embodiment of the first polishing module 106A including a polishing media magazine 902, a polishing table 904, and a drive system 906. The second polishing module 106B can be similarly configured.

The polishing media magazine 902 generally comprises an unwind 908 and a winder 910. A web 912 of polishing media is run between the unwind 908 and the winder 910. The web 912 can be substantially "rolled-up" at either the unwind 908 and the winder 910, or partially wound on both the unwind 908 and the winder 910 such that various portions of the web 912 may be selectively exposed upon the polishing table 904, thus defining the polishing surface 168. The web 912 may be indexed or advanced, between or during wafer processing.

The web 912 of polishing media is generally comprised of a thin polymeric film having a working surface 914 comprising either a polishing pad or fixed abrasive covering at least a portion of the width of the web 912. The web 912 of polishing media may be substantially impermeable to the polishing fluid (i.e., a slurry, deionized water or other fluid media that assists in polishing). The working surface 914 may optionally comprise an abrasive coating, finish, covering, texture or combination thereof.

The polishing table 904 supports the web 912 during processing when the polishing head 164 and the wafer 126 are disposed against the working surface of the web 912. At least one nozzle 916 is disposed on the polishing table 904 adjacent each web 912 to introduce a polishing fluid or other fluid to the working surface 914 of the web 912 during wafer processing. Generally, the polishing fluid provides chemical activity that assists in the polishing process. The polishing fluid is typically selected dependant on the material being polished and may contain an abrasive component. Optionally, the working surface 914 may comprise an abrasive coating, finish, covering and/or texture. An example of such a polishing media magazine 902 is described in U.S. patent application Ser. No. 08/833,278, filed Apr. 4, 1997 by Donohue et al., which is hereby incorporated by reference in its entirety.

The polishing media magazine 902 may further comprise one or more conditioning devices 918 that may be actuated to contact and condition the working surface 914 of the web 912. Generally, the conditioning device 918 comprises two rollers driving in opposing directions that are selectively actuated against with the working surface 914 of the web 912 to condition the working surface 914. The conditioning device 918 conditions (i.e., dresses) the working surface 914 of the web 912 to create a uniformly textured surface that removes material from the surface of the wafer at a uniform rate. Other types of conditioning devices 918 may optionally be utilized alone or in conjunction with the rollers. Examples of such devices are described in U.S. patent application Ser. No. 09/651,659, filed Aug. 29, 2000 by Sommer et al., which is hereby incorporated by reference in its entirety.

Figure 10:
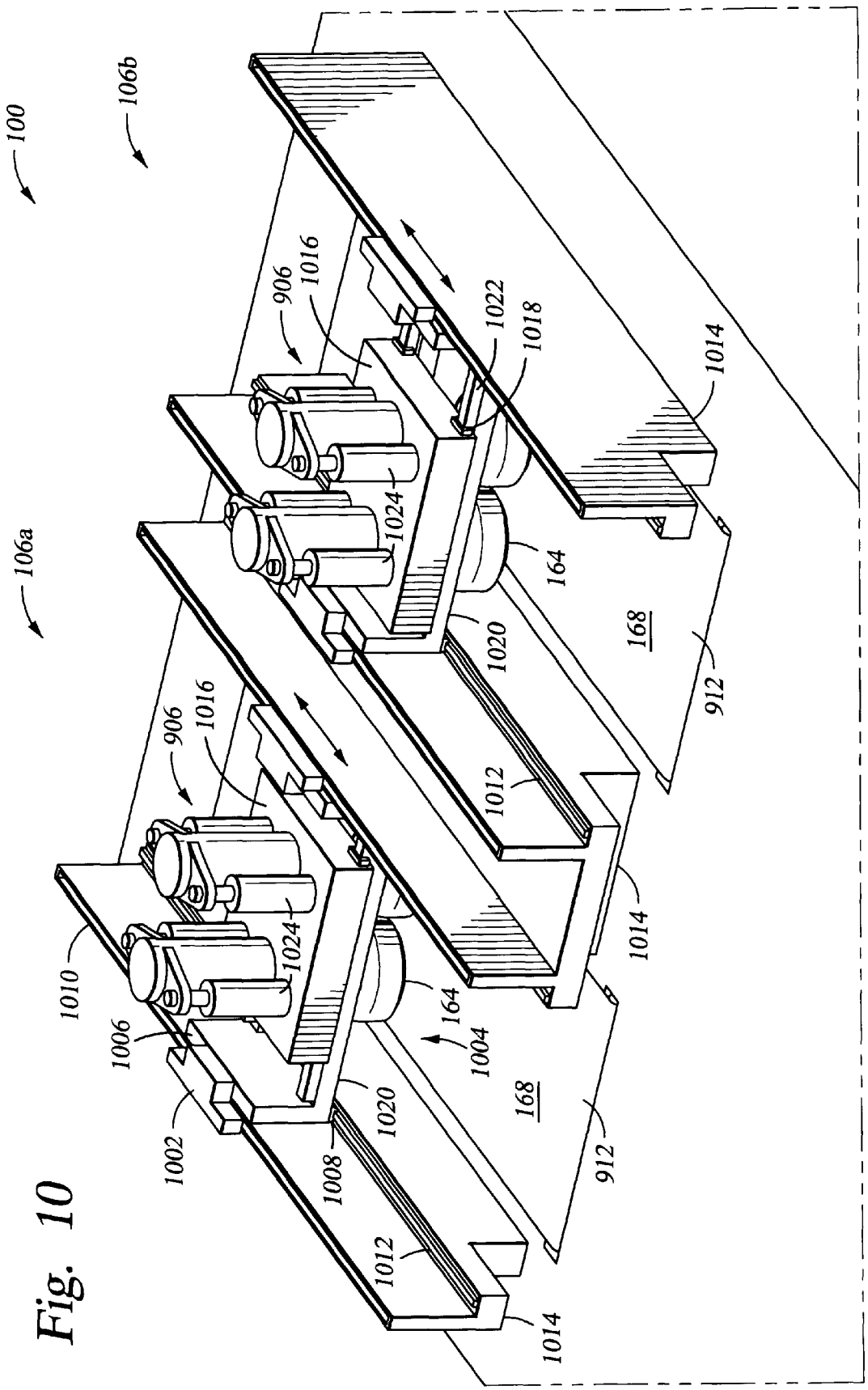
FIG. 10 is a perspective view of a drive system.
Figure 11:
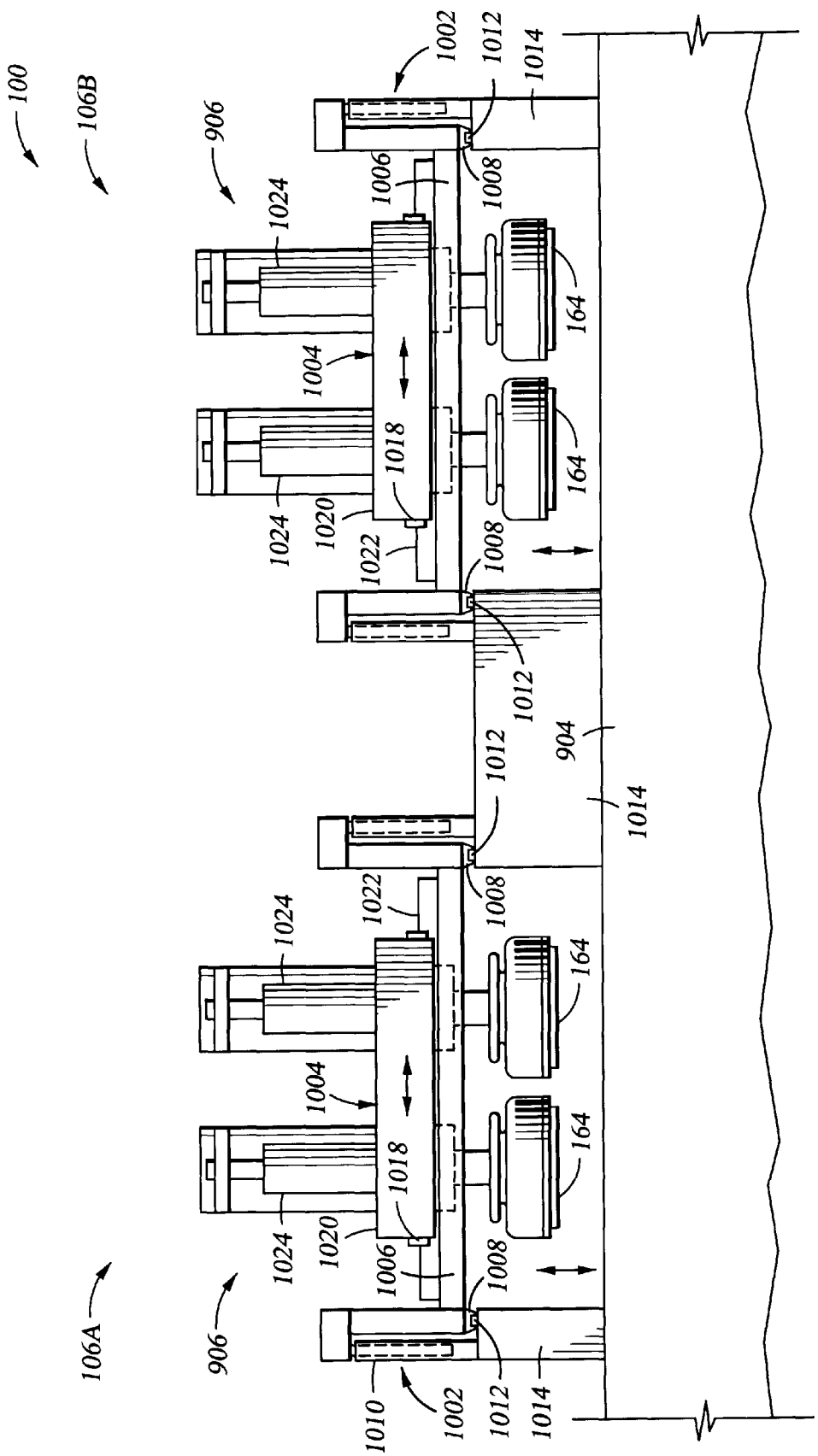
FIG. 11 is an elevation of the drive system of FIG. 10.

FIGS. 10 and 11 are a perspective view and an elevation of one embodiment of the system 100 illustrating the drive system 906 found on each polishing module 106A, 106B. The drive system 906 is coupled to the polishing table 904. The drive system 906 typically comprises a first linear motion device 1002, a second linear motion device 1004 and one or more polishing heads 164. The polishing head 164 is movably positioned above the working region 168 of the web 912. The first linear motion device 1002 and the second linear motion device 1004 (which could be replaced by one device providing at least an equivalent range of motion) couples the polishing head 164 to the polishing table 904. The linear motion devices 1002, 1004 move the polishing head 164 in programmable pattern in relation to the polishing table 904. Optionally, more than one polishing head 164 may be positioned on each drive system 906.

The first linear motion device 1002 generally comprises a stage 1006, a roller bearing guide 1008 and a driver 1010. The stage 1006 is fabricated from aluminum or other light weight material. The stage 1006 may comprise stiffening ribs to minimize the deflection in a direction normal to the polishing table 904. The use of light weight materials minimizes the inertia of the stage 1006 that effects stage motion. The guide 1008 is coupled to the stage 1006 and interfaces with a rail 1012 disposed on a support 1014 fixed to the polishing table 904. The guide 1008 allows the stage 1006 to move along the support 1014 in a linear motion generally parallel to the length of the webs 912. The guide 1008 may alternatively comprise solid bearings, air bearings or similar devices. The driver 1010 provides motion to the stage 1006 relative the polishing table 904. The driver 1010 may comprise "Sawyer" motors, ball screws, cylinders, belts, rack and pinion gears, servo motors, stepper motors and other devices for creating and controlling linear motion. Generally, one portion of the driver 1010 is connected to the support 1014 while a second portion is connected to the stage 1006.

The second linear motion device 1004 generally comprises a carrier 1016, a roller bearing guide 1018 and a driver 1020. The carrier 1016 is also fabricated from aluminum or other light weight material. The guide 1018 is coupled to the carrier 1016 and interfaces with a rail 1022 disposed on stage 1006. The guide 1018 allows the carrier 1016 to move along the stage 1006 in a linear motion substantially perpendicular to the motion of the stage 1006. The guide 1018 may alternatively comprise solid bearings, air bearings or similar bearing devices. The driver 1020 provides motion to the carrier 1016 relative the stage 1006. The driver 1020 may comprise "Sawyer" motors, ball screws, cylinders, belts, rack and pinion gears, servo motors, stepper motors and other devices for creating and controlling linear motion.

The one or more polishing heads 164 are disposed on the carrier 1016. In one embodiment, the polishing head 164 is a DIAMOND HEAD wafer carrier 1016, available from Applied Materials, Inc., Santa Clara, Calif. The one or more polishing heads 164 are coupled to the carrier 1016 in a position such that the polishing head 164 is disposed above the web 912. Each polishing head 164 is coupled to the carrier 1016 via one or more actuators 1024 that provides motion to the polishing heads 164 in a direction normal to the working surface 914 of the web 912. The range of motion of the polishing head 164 allows a wafer 126 disposed in the polishing head 164 to contact the working surface 168 of the web 912. An example of a drive system that may be modified to benefit from the invention is described in U.S. patent application Ser. No. 08/961,602, filed Oct. 31, 1997 by Sommer, which is hereby incorporated by reference in its entirety.

Referring back to FIG. 1, wafers 126 returning to the wafer transfer corridor 104 from the first polishing module 106A are either processed in the polishing module 106B or transported to the second staging area 136 where the wafers are set on the fifth and sixth staging platforms 156, 158. From the fifth and sixth staging platforms 156, 158, the second transfer robot 154 retrieves the wafers (from one platform, then the other) through a port 170 at the second end 124 of the wafer transfer corridor 104. The wafers are then loaded through the entrance port 172 into the cleaning module 108.

Once the wafer has been cleaned, rinsed and dried, the wafer is then positioned adjacent the second port 118 where the cleaned wafer is removed from the cleaning module 108 by the first transfer robot 110 and returned to one of the one or more wafer cassettes 102.

The relative position of multiple polishing modules 106 along the transfer corridor 104 in concert with the utilization of the cleaning module 108 as a return path to the wafer cassettes 102 provides a compact system 100 footprint that allows for multiple wafer processing. Moreover, the system 100 may be configured with additional polishing modules 106 with minimal additional consumption of floor space.

Referring primarily to FIG. 1, an illustrative processing sequence is described demonstrating one possible processing sequence. One skilled in the art will recognize that other processing sequences are envisioned and readily accommodated. In operation, a first unpolished wafer is removed from one of the wafer cassettes 102 by the first transfer robot 110, flipped and placed on either the first or second staging platform 130, 132 in the first staging area 128. Typically, the first transfer robot 110 then retrieves a second unpolished wafer to fill the other staging platform so that both the first and the second staging platforms 130, 132 contain unpolished wafers.

The first corridor robot 138 moves over the first staging area 128, aligning the grippers 142, 146 concentrically above the wafers disposed in the staging platforms 130, 132. The first staging platform 130 and the second staging platform 132 are actuated, elevating the wafers residing on the base 302 of the staging platforms to a position co-planar with the notches 410 of the posts extending from the grippers 142, 146. The grippers 142, 146 are then actuated to grasp the perimeter of the wafers in the notches 410 of the gripper 142, 146. The staging platforms 130, 132 are subsequently lowered to permit the grippers 142, 146 securing the wafers 126 to be transported away from the first staging area 128. Once the wafers are cleared from the first staging area 128, a second pair of wafers is queued for processing in the first staging area 128.

The wafers carried by the first corridor robot 138 are moved over the first shuttle table 160 and positioned concentrically above the load cups 166 disposed on the first shuttle table 160. The load cups 166 are then vertically actuated to a level where the wafers may be released by the first corridor robot 138 into the load cups 166 without damage. The wafers are released from the first corridor robot 138 by de-actuating the grippers 142, 146 (i.e., spreading the first and second members 502, 504 apart). Once the wafers are in the load cups 166, the load cups 166 are retracted, allowing the first shuttle table 160 to move free of the first corridor robot 138.

The first shuttle table 160 containing the wafers in the load cups 166 are moved from the wafer transfer corridor 104 to a position proximate the first polishing module 106A. The drive system 906 of the first polishing module 106A positions the polishing heads 164 concentrically above the load cups 166. The load cups 166 are actuated to load the wafers into the polishing heads 164. The drive system 906 then moves the wafers over the polishing web 912. The wafers are brought into contact with the polishing web 912 in the presence of the polishing fluid, and moved in a predetermined polishing pattern, polishing the wafers surface against the polishing web 912.

After polishing is complete, the wafers are returned to the load cups 166 of the first shuttle table 160. The first shuttle table 160 then returns the processed wafers to the wafer transfer corridor 104 wherein the wafers are again retained by the grippers 142, 146 of the first corridor robot 138.

The processed wafers are transferred by the first corridor robot 138 to the third staging area 134. Once the wafers in the grippers 142, 146 of the first corridor robot 138 are concentrically aligned with the third and the fourth staging platforms 150, 152, the third and the fourth staging platforms 150, 152 are vertically actuated to place the base 302 of the staging platforms 150, 152 proximate the wafers. The grippers 142, 146 are de-actuated and the wafers are positioned on the third and fourth staging platforms 150, 152. The staging platforms 150, 152 are then lowered to permit the first corridor robot 138 to exit the third staging area 134 and retrieve the queued set of wafers from the first staging area 128 for processing in the first polishing module 106A. The wafers in the third staging area 134 are queued for polishing in the second polishing module 106B.

The second corridor robot 140 retrieves the wafers processed in the first polishing module 106A from the third staging area 134 in a manner similar to the sequence described above for the first corridor robot 138. The second corridor robot 140 moves the wafers to the second staging area 136 if no further polishing is required, or to a position where the wafers may be loaded in to the second shuttle table 162. If the wafers are to be polished by the second polishing module 106B, the wafers are transferred by the second shuttle table 162 to the second polishing module 106B wherein the wafers are polished and returned back to the second corridor robot 140 similar to the sequence as described above with reference to the first polishing module 106A.

The queuing of wafer pairs awaiting polishing minimizes the dwell time between polishing. Additionally, the second polishing module 106B may polish a wafer pair as the first polishing module 106A polishes another wafer pair, thus enhancing wafer throughput. Optionally, the second corridor robot 140 may retrieve the wafers from the first shuttle 160 allowing a second set of wafers to be sequentially loaded into the first shuttle 160 to further minimize the dwell time of the polishing module 160A.

The wafers polished by the second polishing module 106B are transferred by the second corridor robot 140 to the second staging area 136. At the second staging area 136, the wafers are placed on the fifth and sixth staging platforms 156, 158. Once in the second staging area 136, the wafers are sequentially retrieved by the second transport robot 154. The second transport robot 154 remove the wafers from the staging platforms 156, 158 and place the wafers on the conveyor 176 within the cleaning module 108. Optionally, all or a sample of polished wafers may be loaded by the second robot 154 into the metrology device 103 for data acquisition before entering the cleaning module 108.

Once in the cleaning module 108, the wafers 126 are then transported by the conveyor 176 from the entrance 172 of the cleaning module 108 to the second port 118 proximate the first transfer robot 110. While passing through the cleaning module 108, the wafers are cleaned of debris, residual slurry and other contamination residing on the wafer's surface.

When the wafer 126 reaches the exit of the cleaning module 108, the first transfer robot 110 retrieves the wafer from the cleaning module 108 and returns the wafer to one of the wafer cassettes 102.

One skilled in the art will appreciate that the illustratively described processing sequence is but one possible variation of a processing sequence that may be performed by the system 100. For example, the wafers may be routed through the polishing stations in any sequence, the wafers may be passes through the cleaning module before, after, or in between polishing operations, the wafers may be routed through one or more polishing stations and returned to the cassettes without cleaning, and so forth.

Although the teachings of the present invention that have been shown and described in detail herein, those skilled in the art can readily devise other varied embodiments that still incorporate the teachings and do not depart from the spirit of the invention.

What is claimed is:

1. A semiconductor wafer planarization system for processing workpieces comprising:
   a transfer corridor having a first end and a second end;
   one or more movable corridor robots disposed in the transfer corridor and laterally positionable in a first direction between the first end and the second end;
   one or more linear polishing modules, each linear polishing module having one or more polishing heads for holding workpieces during processing; and at least one laterally movable loading device having at least one load cup, the loading device adapted to transfer workpieces laterally in a second direction between at least one of the one or more corridor robots and the one or more polishing heads.

2. The system of claim 1 further comprising:
a first robot disposed adjacent the first end.

3. The system of claim 2 further comprising:
one or more wafer storage cassettes disposed adjacent the first robot, wherein the first robot is adapted to transfer workpieces between the cassettes and the first end of the transfer corridor.

4. The system of claim 2 further comprising:
a second robot disposed adjacent the second end and adapted to retrieve workpieces from the second end.

5. The system of claim 2 further comprising:
a cleaning module disposed adjacent the transfer corridor.

6. The system of claim 4 further comprising:
a cleaning module disposed adjacent the transfer corridor between the first robot and the second robot.

7. The system of claim 5 further comprising:
a metrology device disposed adjacent the transfer corridor and cleaning module.

8. The system of claim 1 further comprising:
one or more staging areas disposed between the first end and the second end of the transfer corridor.

9. The system of claim 8, wherein each staging area comprises one or more staging platforms.

10. The system of claim 9, wherein each staging platform comprises:
a body;
a rim extending from the body having notches cut therein; and
one or more nozzles adapted to maintain the workpiece disposed on the platform in a wet condition.

11. The system of claim 1 further comprising:
a first staging area disposed at the first end of the transfer corridor;
a second staging area disposed at the second end; and
a third staging area disposed between the first and second staging areas.

12. The system of claim 1, wherein the one or more corridor robots comprises:
a first corridor robot; and
a second corridor robot.

13. The system of claim 1, wherein at least one of the one or more corridor robots comprises:
a first gripper; and
a second gripper.

14. The system of claim 13, wherein each gripper further comprises:
a first member;
a second member movable relative to the first member;
a plurality of posts extending the first member and second member; and
a co-planar notch formed in each post.

15. The system of claim 1, wherein the at least one loading device comprises a first load cup and a second load cup.

16. The system of claim 1, wherein the at least one loading device comprises:
a yoke,
a first load cup disposed on the yoke;
a second load cup disposed on the yoke;
a positioning mechanism for moving the yoke between a first position accessible by at least one of the one or more corridor robots and a second position accessible by one of the polishing modules.

17. The system of claim 1, wherein the at least one loading device moves substantially perpendicular to a path of at least one corridor robot.

18. The system of claim 1, wherein the at least one loading device comprises a first shuttle table and a second shuttle table.

19. The system of claim 1, wherein the one or more polishing modules comprises a first polishing module and a second polishing module.

20. The system of claim 1, wherein the one or more polishing modules comprise a first polishing head and a second polishing head.

21. The system of claim 1, wherein the one or more polishing modules comprises:
a first polishing module and a second polishing module, and wherein the at least one loading device comprises:
a first shuttle table adapted to transfer workpieces between the first polishing module and the at least one of the one or more corridor robots; and
a second shuttle table adapted to transfer workpieces between the second polishing module and at least one of the one or more corridor robots.

22. The system of claim 21, wherein each polishing module comprises a first polishing head and a second polishing head.

23. A semiconductor wafer planarization system for processing workpieces comprising:
a transfer corridor having a first staging area, a second staging area and a third staging area, the first staging area disposed proximate a first end of the transfer corridor, the second staging area disposed proximate a second end of the transfer corridor, and the third staging area disposed between the first and second staging areas;
a first corridor robot disposed in the transfer corridor and positionable in a first direction between the first staging area and the third staging area;
a second corridor robot disposed in the transfer corridor and positionable in the first direction between the third staging area and the second staging area;
one or more polishing linear modules, each polishing module having one or more polishing heads for holding workpieces during processing;
at least one laterally movable loading device having at least one load cup, the loading device adapted to transfer workplaces laterally in a second direction between the corridor robots and the one or more polishing heads.

24. The system of claim 23, wherein the one or more polishing module comprises a first polishing module and a second polishing module, each polishing module further comprising a first polishing head and a second polishing head.

25. The system of claim 23, wherein each staging area comprises a first staging platform and a second staging platform.

* * * * *